United States Patent
Arcamone et al.

(10) Patent No.: US 8,373,513 B2
(45) Date of Patent: Feb. 12, 2013

(54) COMPENSATED MICRO/NANO-RESONATOR WITH IMPROVED CAPACITIVE DETECTION AND METHOD FOR PRODUCING SAME

(75) Inventors: Julien Arcamone, Saint-Martin-le-Vinoux (FR); Eric Colinet, Bois-Guillaume (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 31 days.

(21) Appl. No.: 12/965,037

(22) Filed: Dec. 10, 2010

(65) Prior Publication Data
US 2011/0140792 A1 Jun. 16, 2011

(30) Foreign Application Priority Data
Dec. 10, 2009 (FR) ...................................... 09 05974

(51) Int. Cl.
*H03B 5/30* (2006.01)
*H01L 41/047* (2006.01)
*H03H 9/15* (2006.01)

(52) U.S. Cl. ........ 331/154; 331/185; 310/366; 310/368; 333/186

(58) Field of Classification Search ................ 310/311, 310/365–369; 331/154, 163, 185; 333/186–188
See application file for complete search history.

(56) References Cited

U.S. PATENT DOCUMENTS

| 5,491,604 | A  | * | 2/1996  | Nguyen et al. ................. 361/278 |
| 7,616,077 | B1 |   | 11/2009 | Wittwer et al. |
| 7,750,758 | B2 | * | 7/2010  | Zhiyu et al. .................... 333/186 |
| 2004/0065940 | A1 |   | 4/2004 | Ayazi et al. |
| 2006/0181273 | A1 | * | 8/2006 | Greywall et al. ............. 324/256 |
| 2009/0153267 | A1 |   | 6/2009 | Lutz et al. |
| 2011/0067984 | A1 | * | 3/2011 | Nguyen et al. ................. 200/181 |

OTHER PUBLICATIONS

Palaniapan et al., "Micromechanical resonator with ultra-high quality factor," *Electronic Letters*, Sep. 27, 2007, 2 pgs., vol. 43, No. 20, IEEE.

Xie et al., "1.52-GHz Micromechanical Extensional Wine-Glass Mode Ring Resonators," *IEEE Transactions on Ultrasonics, Ferroelectrics, and Frequency Control*, Apr. 2008, pp. 890-907, vol. 55, No. 4, IEEE.

* cited by examiner

*Primary Examiner* — Levi Gannon
(74) *Attorney, Agent, or Firm* — Oliff & Berridge, PLC

(57) ABSTRACT

The resonator comprises an oscillating element and first and second excitation electrodes of the oscillating element. An AC signal generator is connected to the first and second excitation electrodes and delivers first and second signals of the same amplitudes and in antiphase on the first and second electrodes. A first DC voltage source is connected to a third electrode. A second DC voltage source is connected to a fourth electrode. An additional electrode is electrically connected to the oscillating element. A signal representative of oscillation of the oscillating element is provided by the additional electrode formed by an anchoring point of the oscillating element and biased by a third DC voltage.

12 Claims, 4 Drawing Sheets

COMPENSATED MICRO/NANO-RESONATOR WITH IMPROVED CAPACITIVE DETECTION AND METHOD FOR PRODUCING SAME

BACKGROUND OF THE INVENTION

The invention relates to a resonator comprising an oscillating element and first and second excitation electrodes of the oscillating element.

The invention also relates to an oscillator and to a method for producing such a resonator excited by means of first and second electrodes.

STATE OF THE ART

In order to be able to continue the race towards miniaturization, micro-electronic circuits are having to integrate new functions while at the same time minimizing the surface area of circuits. One of the major fields of study is integration of resonant devices within chips. Indeed, in a large number of fields such as time bases (time references), gas-phase chemical sensors, molecular force sensors or mass spectrometers, it is interesting for the integrated circuit to comprise at least one electro-mechanical oscillator. Designers are working on replacing the oscillator, which is an additional discrete component, by an integrated electro-mechanical oscillator (based on a resonant microsystem). By integrating this oscillator, it can then be hoped to obtain a gain in the energy consumed and an improvement of performances, in addition to the gain in surface area or in volume of the device.

In conventional manner, the resonator comprises an oscillating element which is set in motion, at a given frequency, around a fixed position. This motion is at a maximum at the resonance frequency and almost zero outside this frequency. The resonator also comprises an excitation electrode which applies the force necessary for motion of the oscillating element. The resonator also comprises a detection electrode which is influenced by the position of the oscillating element and which produces an electric signal representative of the oscillation (signal maximum at resonance and almost zero outside).

The resonator is characterized by a certain number of quantities representative of the device and of its production technology. Resonators are characterized by their resonance frequency $f_0$ which depends on the geometric parameters of the oscillating element and on the materials which constitute the latter. The resonator is also characterized by its quality factor Q linked to the energy losses within the resonator (the lower the losses, the higher the quality factor).

In the case of capacitive detection of motion of the oscillating element, the behaviour of the resonator (the oscillating element and the fixed parts) can be modeled by means of a RLC circuit and a stray capacitance $C_{PA}$ connected in parallel. When the oscillating element moves at the resonance frequency, the capacitance and inductance values cancel each other out and only the resistance called motional resistance, noted $R_M$, remains in the RLC circuit. This motional resistance enables the electro-mechanical performance of the resonator to be characterized (the smaller the motional resistance, the better the performance of the resonator in the sense that, for a given excitation voltage, the resonator will generate more current).

Whatever the mechanical structure used, a capacitive coupling Cpa always exists between the excitation electrode and the detection electrode. This stray coupling induces an electric signal, commonly called "background signal", i.e. a background stray current, noted $i_P$. This stray signal is present over the whole frequency range used by the resonator. This stray signal is superposed on the resonance electric signal which originates from the resonator, i.e. the motional current noted $i_M$.

Depending on the case involved, the stray signal can partly or totally mask the resonance signal. In general manner, the detrimental influence of too high a stray coupling capacitance is expressed by four components:

(i) an antiresonance peak exists which is offset with respect to the mechanical resonance peak,
(ii) the relative gain of the resonator signal with respect to the background signal is reduced,
(iii) the phase change at resonance is reduced as
(iv) the background signal is increased.

This results in being able to obtain a closed loop oscillator from capacitive detection of the oscillations of such a resonator being rendered difficult as the gain and phase change are reduced. All this stems from the fact that the form and the information from the capacitive detection signal are modified or even erased by stray capacitance $C_{PA}$. Accessorily, the fact of having a background signal with a high amplitude (a high-intensity signal) can result in saturation of the electronic circuit performing amplification of the signal.

Different measuring configurations have been proposed to limit the influence of the stray signal when using the capacitive detection resonator. Palaniapan et al. ("Micromechanical resonator with ultra-high quality factor", Electronics Letters, vol. 43, n°20, September 2007) proposed a differential detection structure which attenuates the effect of stray capacitance $C_{PA}$.

As illustrated in FIG. 1, the resonator comprises an oscillating element 1, first 2 and second 3 excitation electrodes, third 4 and fourth 5 detection electrodes and an additional electrode 6 which is interconnected to oscillating element 1. The resonator also comprises a conversion unit 15 which transforms a single signal into two signals in antiphase, this unit 15 being connected to first 2 and second 3 excitation electrodes. This conversion unit 15 applies voltages of the same amplitude but in antiphase on first 2 and second 3 excitation electrodes.

A similar set-up is made at the level of detection electrodes 4 and 5 to obtain the signal representative of oscillation of oscillating element 1. Third 4 and fourth 5 electrodes are connected to another conversion unit 16 which is different and which outputs a signal representing subtraction of the signals coming from third 4 and fourth 5 electrodes. A bias voltage $V_P$ is applied to additional electrode 6 which is electrically interconnected with oscillating element 1.

This measuring configuration provides an answer to attenuation of the effect of stray capacitance $C_{PA}$ on the characteristics of the resonator that is totally theoretical. To achieve elimination of the stray component, this architecture does in fact have to comprise four electrodes of exactly the same length, four electrode-resonator air-gaps of exactly the same dimension. The test probes and/or connection lines also have to be identical in all points. In so far as such an architecture is not able to be produced from a technological standpoint, nor from the instrumentation standpoint, the question involved in the effect of the stray capacitance on the characteristics of the output signal remains outstanding.

An identical fabrication problem also arises from the publication by Xie et al (1.52-GHz Micromechanical Extensional Wine-Glass Mode Ring Resonators, IEEE transactions on ultrasonics, ferroelectrics, and frequency control, vol. 55, n°4, April 2008) which uses two groups of electrodes connected to each other along a diameter of the resonator of cylindrical geometry. Different approaches are proposed to eliminate or reduce parasitic vibration modes but it is always necessary to have a perfect structure from a point of view of the geometry and of the required dimensions in order to achieve a reduction of the stray component.

OBJECT OF THE INVENTION

The object of the invention is to provide a resonator whereby the effect of stray capacitances on the output characteristics of resonator can be reduced or even eliminated while at the same time being easy to implement.

The resonator according to the invention is characterized by the appended claims and more particularly by the fact that it comprises:
an oscillating element,
first and second excitation electrodes of the oscillating element each having a main surface at least partially facing the oscillating element,
means for applying, on each excitation electrode, a signal having an AC component to make the oscillating element oscillate by means of the excitation electrodes so that the oscillating element moving towards one of the excitation electrodes, it moves away from the other excitation electrode, the AC components being in antiphase between the first and second excitation electrodes,
an additional electrode electrically connected to the oscillating element at a point such that the capacitive influences of the excitation electrodes neutralize each other,
means for applying a DC voltage difference between the oscillating element and the excitation electrodes,
a signal representative of oscillation of the oscillating element provided by means of the additional electrode,
a third bias electrode connected to a first DC voltage source.

It is a further object of the invention to provide a method which is easy to implement and which ensures that a resonator symmetrical from an operating point of view is obtained in spite of the dissymmetry intrinsic to production.

The method according to the invention is characterized in that it comprises:
application of an excitation signal with an AC component on each of the excitation electrodes, the AC components being in antiphase between the first and the second excitation electrode,
application of a first Bias DC voltage to a third electrode to move the oscillating element so that the value of the following equation is reduced:

[$(C_{02}+C_{P42}) \cdot V_{IN2}+(C_{03}+C_{P43}) \cdot V_{IN3}$] in which $C_{P42}$ and $C_{P43}$ are respectively the electric capacitance values of the first and second stray capacitances linked to the excitation electrodes,
$V_{IN2}$ and $V_{IN3}$ are the AC components respectively applied to the first excitation electrode and to the second excitation electrode,
$C_{02}$ and $C_{03}$ are respectively the values of the nominal capacitances of the first and second excitation electrodes at rest as a function of time,
application of a DC voltage difference between the oscillating element and the excitation electrodes,
measurement of an output signal on the additional electrode.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Figure 1:
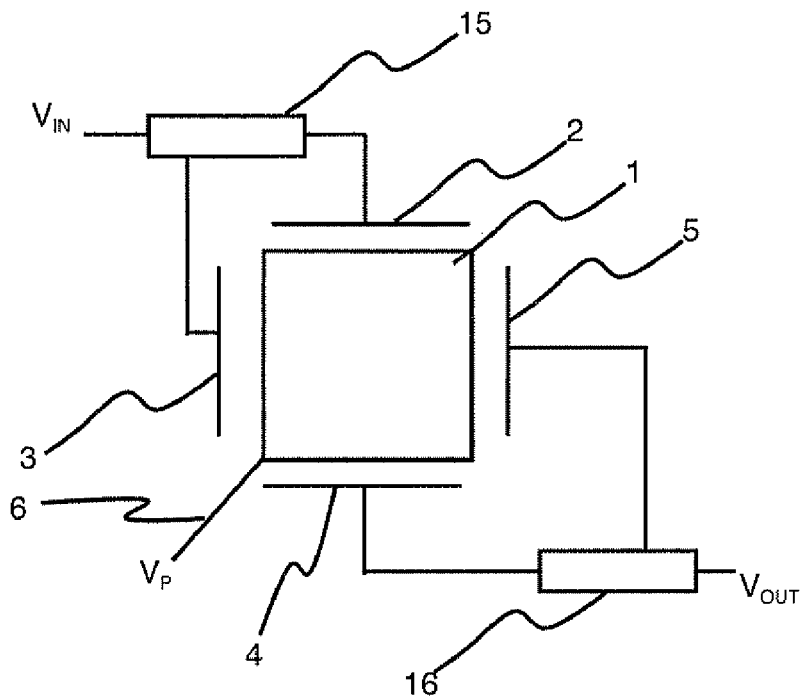
FIG. 1 represents a resonator according to the prior art, in schematic manner.
Figure 2:
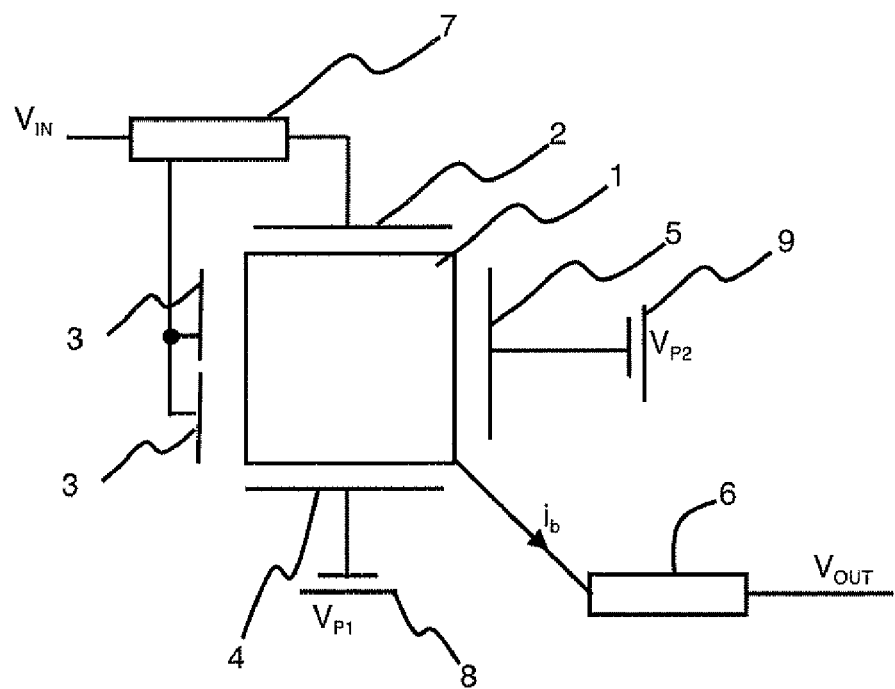
FIG. 2 represents a resonator according to the invention, in schematic manner.

As illustrated in FIG. 2, the resonator comprises an oscillating element 1 and a plurality of electrodes arranged at a distance from oscillating element 1. The oscillating element is made from conducting or semi-conducting material, for example a doped semi-conductor, which can be actuated by electrostatic forces. The oscillating element is secured to the substrate via anchoring points formed in or on the support substrate. The resonator is of micrometric or nanometric size and can therefore be produced by means of conventional microelectronics industry techniques.

A first set of excitation electrodes is formed at least by a pair of excitation electrodes, here first 2 and second 3 excitation electrodes of oscillating element 1. Depending on the embodiments, the first and second excitation electrodes can be facing each other or not, but the excitation electrodes are always at least partially facing oscillating element 1. In an alternative embodiment, it is possible to have a plurality of first excitation electrodes and/or a plurality of second excitation electrodes (electrodes 3 of FIG. 2).

The resonator comprises at least a third bias electrode 4. For example purposes illustrated in FIG. 2, a second set of bias electrodes is formed here by third 4 and fourth 5 electrodes. Third 4 and fourth 5 bias electrodes are at least partially facing the oscillating element and serve the purpose of creating a non-zero current in the oscillating element able to be used on output of the resonator. Each electrode also serves the purpose of moving the oscillating element, via the electrostatic force it imposes, in the direction perpendicular to its principal axis so as to tend to equalize the electrostatic forces of the excitation electrodes by modifying the air-gaps (due to the movements induced). Each bias electrode is associated with a distinct voltage source.

Figure 3:
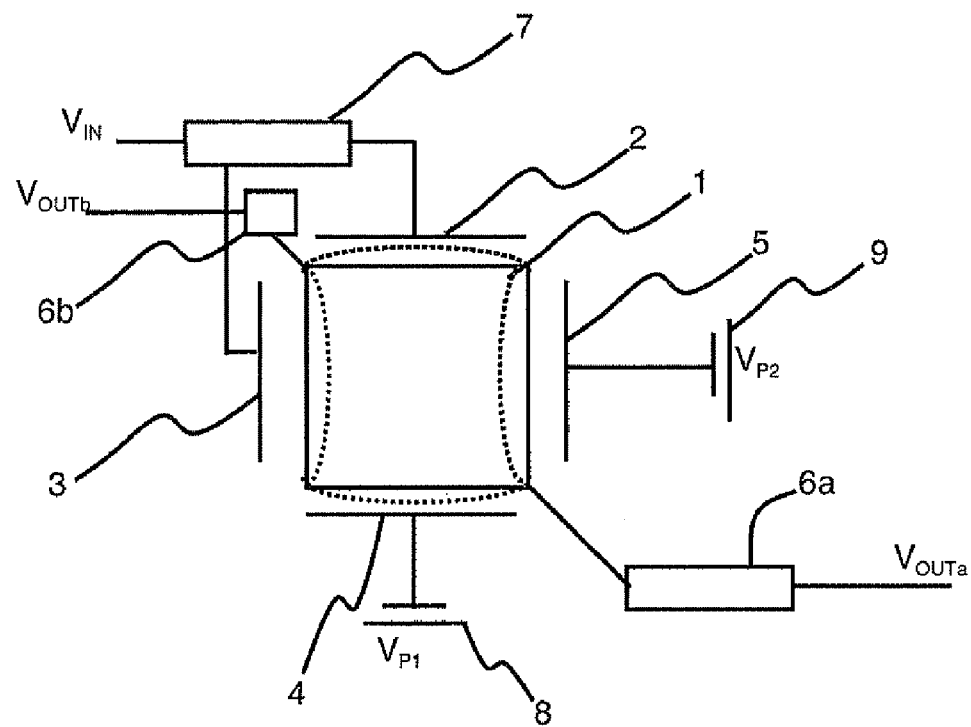
FIGS. 3 to 5 represent different embodiments of a resonator and different vibration modes of the oscillating element, in schematic manner.
Figure 4:
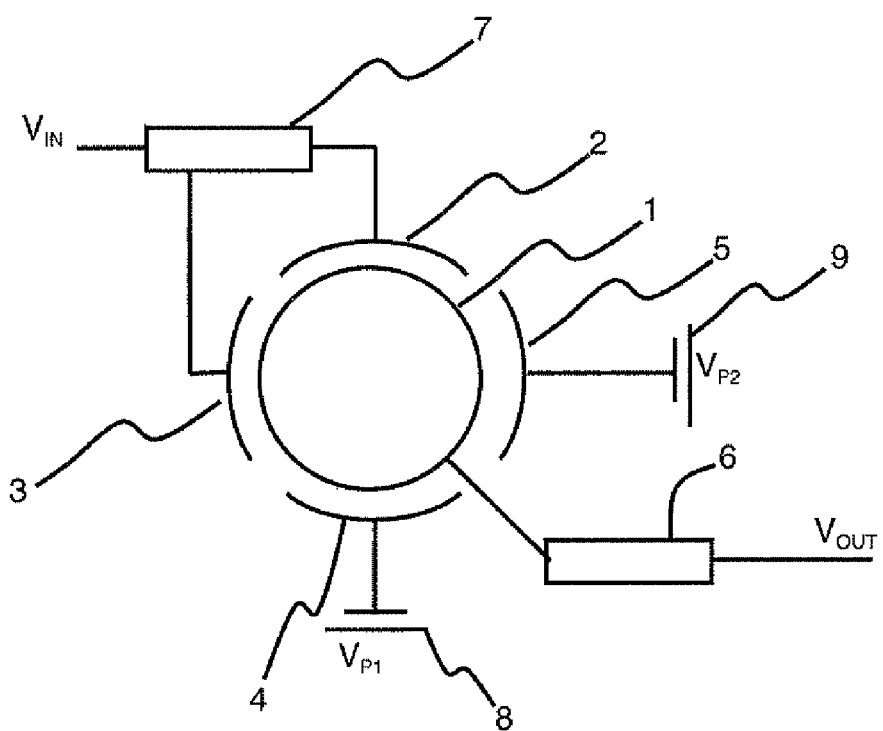
Figure 5:
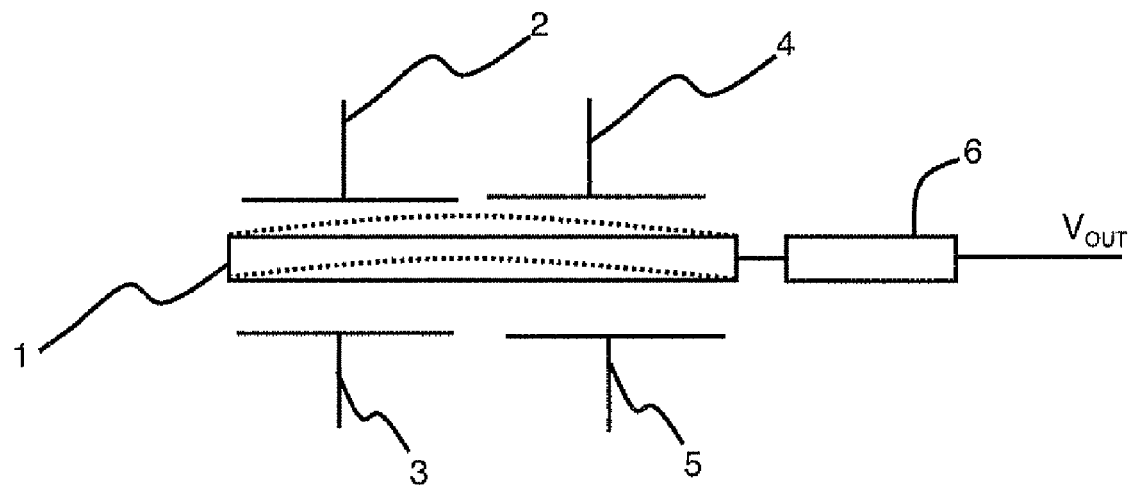

The resonator also comprises an additional electrode 6 or a set of additional electrodes 6a, 6b (FIG. 3) which are electrically connected to oscillating element 1 and which provide an electric signal representative of oscillation of oscillating element 1 ($V_{OUTa}$ and $V_{OUTb}$) on output from the resonator. Additional electrode 6 is at a point such that the capacitive influences of the excitation electrodes are equalized and therefore neutralize one another on account of the differential nature of the excitation. The additional electrode and its electric connection, such as its metal track and/or connection wires, are arranged in such a way that the capacitive influences of the excitation electrodes are equalized and neutralize one another. The influence of the first excitation electrode is identical to the influence of the second excitation electrode.

If a plane of symmetry exists between the first and second excitation electrodes, the additional electrode is located on this axis of symmetry and its electric connection follows this axis so as to have equivalent or equal influences from the first and second excitation electrodes.

If no plane of symmetry exists, for example because there is not the same number of first and second excitation electrodes, or the same electrode arrangement, or the same facing surface, the position of the additional electrode is offset with respect to the previously defined plane of symmetry so as to compensate the capacitive influences on additional electrode 6.

In general manner, additional electrode 6 is produced by any suitable means, by a conduction means placed on the oscillating element and which enables the output signal to be output.

In a particular embodiment, resonator output signal $V_{OUT}$, i.e. the signal representative of oscillation of oscillating element 1, is measured by means of one of the mechanical anchoring points of oscillating element 1. This mechanical anchoring point forms additional electrode 6 and must be electrically conductive. The additional electrode is the anchoring point or one of the anchoring points situated in the plane of symmetry or near to the plane of symmetry if no anchoring point exists in the plane of symmetry.

Using the anchoring point as additional electrode 6 enables the structure to be simplified and facilitates output of signal $V_{OUT}$. The electric connection from the anchoring point to transmit the output signal is preferably oriented along the axis of symmetry if the latter exists, otherwise it is oriented so as to compensate the capacitive influences of the first and second excitation electrodes. In advantageous manner, the additional electrode is formed by the anchoring point the farthest away from the excitation electrodes in order to have a reduced background signal.

Oscillating element 1 is for example of plate type, disk type or embedded-embedded or embedded-free beam type. The vibration mode of the resonator and its architecture, i.e. at least that of oscillating element 1 and of excitation electrodes 2 and 3, are such that when the oscillating element moves towards first excitation electrode 2, it simultaneously moves away from second excitation electrode 3. Advantageously, when oscillating element 1 moves a certain distance towards one of the excitation electrodes, it moves the same distance away from the other excitation electrode.

Oscillation of the oscillating element is achieved by any means 7 for making oscillating element 1 oscillate by means of excitation electrodes 2, 3 so that when oscillating element 1 moves towards one of the excitation electrodes, it moves away from the other excitation electrode. This type of oscillation can be obtained for example by applying forces (or pressures depending on the configuration) of the same amplitude but in antiphase, at two distinct locations of oscillating element 1. In conventional manner, oscillation of the oscillating element is achieved by arranging excitation electrodes 2, 3 judiciously with respect to the anchoring points.

For example purposes illustrated in FIGS. 2 to 7, oscillation can be achieved by means of a device generating two signals in antiphase 7, here a power splitter, connected to first 2 and second 3 excitation electrodes. The device for generating signals respectively delivers first and second signals of the same amplitude and in antiphase on first 2 and second 3 electrodes. In conventional manner, the device for generating signals in antiphase and of the same amplitude is not perfect and phase differences may exist which the resonator (via its electric assembly) is able to compensate. In other words, the signals imposed on the excitation electrodes comprise an AC component in antiphase as illustrated in FIGS. 2 to 7, but they can also comprise a DC component (not illustrated).

The device for generating two signals is for example a directional coupler or power splitter 7 having an input terminal and at least first 7a and second 7b output terminals. First 7a and second 7b output terminals are respectively connected to first 2 and second 3 excitation electrodes. An original excitation signal $V_{IN}$ is applied on the input terminal of power splitter 7 and is divided into voltages $V_{IN2}$ and $V_{IN3}$. If power splitter 7 is perfect, voltage $V_{IN2}$ on first output terminal 7a, and therefore on first excitation electrode 2, is the opposite of voltage $V_{IN3}$ on second output terminal 7b, and therefore on second excitation electrode 3 ($V_{IN2}=-V_{IN3}$). On output, power splitter 7 delivers first and second excitation signals respectively on first 2 and second 3 excitation electrodes. The first and second excitation signals are in antiphase, i.e. their phase difference is equal to 180°. The first and second signals present the same amplitude.

First 2 and second 3 excitation electrodes serve the purpose of actuating oscillating element 1 in capacitive manner, which element then vibrates around a fixed position. The oscillating element advantageously vibrates in lamé mode for an oscillating element of plate type illustrated in FIG. 3, or in wineglass mode for an oscillating element of disk type illustrated in FIG. 4, or in flexion mode for an embedded-embedded beam illustrated in FIG. 5. For an oscillating element of plate or disk type which vibrates according to the above modes, the first and second excitation electrodes are not facing one another and are advantageously perpendicular to one another. For an oscillating element of embedded-embedded or embedded-free beam type, the first and second excitation electrodes are located on each side of the oscillating element and preferably facing one another.

Each of the bias electrodes, here third 4 and fourth 5 electrodes, comprises a bias voltage application terminal. A first Bias DC voltage $V_{P1}$ is applied on third electrode 4 and a second Bias DC voltage $V_{P2}$ is applied on fourth electrode 5. A first DC voltage source 8 is thus connected to third electrode 4 and a second DC voltage source 9 is connected to fourth electrode 5. The bias electrode or electrodes enable a current to be created in the oscillating element and enable the structure to be moved as described in the foregoing. This current induced in the oscillating element is then measured by additional electrode 6 and serves the purpose of detecting the resonance peak.

To facilitate integration of the resonator in an integrated circuit, the output signal can be modified by a shaping circuit 10 which isolates all or part of the output signal. Shaping circuit 10 is advantageously formed in the integrated circuit or at the same time as the resonator to facilitate analysis of the output signal by circuit 10, thereby keeping the resonator compact. Shaping circuit 10 advantageously only provides the AC component of signal $V_{OUT}$ delivered by oscillating element 1 by means of additional electrode 6.

Shaping circuit 10 can be a bias tee or an active circuit connected to additional electrode 6. Shaping circuit 10 then delivers resonator output signal $V_{OUT}$. The active circuit is for example an operational amplifier which comprises a feedback-connected resistor.

Figure 6:
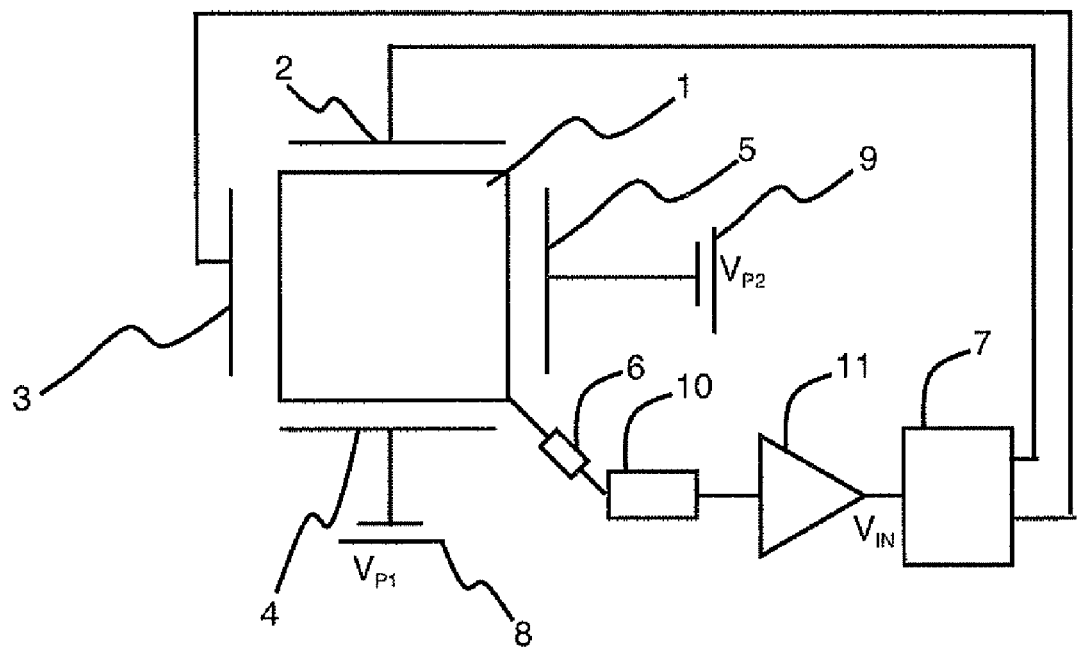
FIG. 6 represents an oscillator obtained by means of a resonator according to the invention, in schematic manner.
Figure 7:
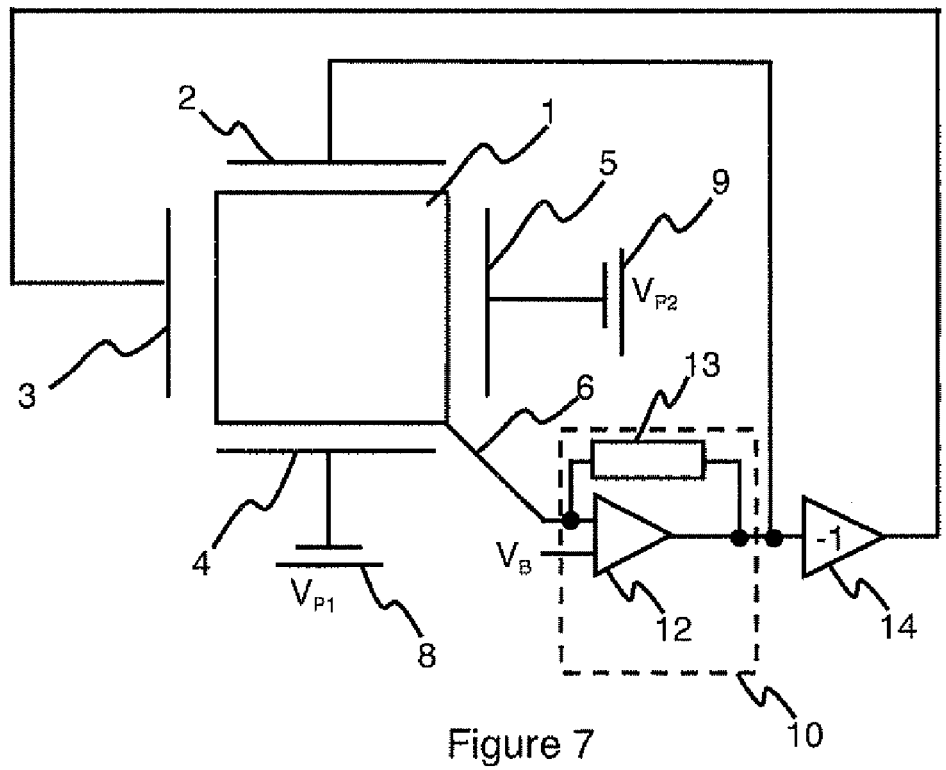
FIG. 7 represents an embodiment of an oscillator obtained by means of a resonator according to the invention, in schematic manner.

In an advantageous embodiment illustrated in FIGS. 6 and 7 enabling an oscillator to be formed in closed loop, the equivalent transimpedance of the closed-loop control circuit is equal or substantially equal to that of the motional resistance of the resonator. In the particular embodiment of FIG. 7 comprising an operational amplifier with a feedback-connected resistor 13, resistor 13 used has a value equal or substantially equal to that of the motional resistance of the resonator.

Shaping circuit 10 enables a DC voltage $V_b$ to be applied to the resonator without output signal $V_{OUT}$ presenting this DC component and without the oscillation signal passing through circuit 10 which would result in a zero output signal 10.

In the ideal case where the architecture obtained is symmetric, the capacitances which exist between a surface of oscillating element 1 and each of detection electrodes 2 and 3 and the two other electrodes 4 and 5 are identical in value. They are all equal to the nominal capacitance called "static capacitance" which exists when oscillating element 1 is at rest. If third DC voltage $V_b$ is not zero, the dynamic electrostatic excitation forces which are applied on oscillating element 1 are of the general form:

$$F(t) \approx \frac{\varepsilon_0 S}{g^2} V_b V_{in}(t)$$

with:
$V_b$: the DC component of the voltage difference which exists between the excitation electrodes and the oscillating element,
$V_{in}(t)$: the AC excitation signal,
S: the facing surface between a surface of the oscillating element and one of the excitation electrodes (supposing that the surfaces are identical for all the surfaces),
g: the air-gap between a surface of the oscillating element and one of the excitation electrodes (supposing that the air-gaps are identical for all the surfaces),
$\varepsilon_0$: the dielectric constant of the medium between the electrodes and the oscillating element.

The dynamic forces arising from the first and second excitation electrodes are of opposite signs on account of the antiphase of the signals received by each of the excitation electrodes.

It can be observed that it is important to have a non-zero DC component $V_b$ of the voltage difference which exists between excitation electrodes 2, 3 and oscillating element 1 to be able to apply an electrostatic force necessary for actuating the oscillating element and that is linear with excitation signal $V_{IN}$. This voltage difference $V_b$ which represents the DC component of the voltage difference has to exist between the excitation electrodes and the oscillating element and has to be added to the AC component coming from means 7 to make oscillating element 1 oscillate.

Additional electrode 6 being electrically connected to oscillating element 1, it is possible in a first particular embodiment to bias the resonator with respect to the excitation electrodes at a predefined DC voltage. The additional electrode continues to retrieve the electric signal (i.e. a current) produced by the oscillating element.

In another particular embodiment, the same additional DC voltage $V_{b'}$ is applied on the first 2 and second 3 excitation electrodes in addition to the first and second excitation signals, whereas the oscillating element is biased to a DC voltage different from Vb' by means of element 6. The voltage applied to excitation electrodes 2 and 3 then comprises a DC component and an AC component.

These two embodiments enable the required voltage difference to be applied between the excitation electrodes and oscillating element 1, but it is also possible to combine these embodiments so that the voltage difference originates partially from the voltage applied on excitation electrodes 2, 3 and from the voltage applied on oscillating element 1.

In general manner, the currents induced in the resonator by the different electrodes, here first 2, second 3, third 4 and fourth 5 electrodes, are summed. The following equations illustrate the particular structures represented with two excitation electrodes and two bias electrodes in a symmetric architecture. When the resonator moves towards one excitation electrode, it moves away from the other excitation electrode and the same is true for the bias electrodes.

The current coming from electrodes 4 and 5 is of the form:

$$i_4 + i_5 \approx (V_{P1} - V_{P2}) \frac{dc(t)}{dt} + 2C_0 \frac{dV_{OUT}}{dt},$$

with
$i_4$ and $i_5$ respectively being the currents induced by third 4 and fourth 5 electrodes,
$V_{P1}$ and $V_{P2}$ respectively being the bias voltages applied on the third and fourth electrodes, $$\frac{dc(t)}{dt}:$$

representing the variation of the induced electric capacitance around the rest value as a function of time,
$C_0$ being the value of the nominal capacitance at rest as a function of time (considered as being identical for electrodes 4 and 5).

This current presents two components, a first component called "motional component" which is a function of the difference between $V_{P1}$ and $V_{P2}$ and a second component called "basic component" which depends on the value of $C_O$.

The current originating from electrodes 2 and 3 is of the form:

$$i_2 + i_3 = (V_{IN2} + V_{IN3}) \frac{dc(t)}{dt} + (C_{02} + C_{PA2}) \frac{d(V_{IN2} - V_{OUT})}{dt} + (C_{03} + C_{PA3}) \frac{d(V_{IN3} - V_{OUT})}{dt},$$

with
$i_2$ and $i_3$ respectively being the currents induced by first 2 and second 3 electrodes,
$V_{IN2}$ and $V_{IN3}$ respectively being the signals applied on first 2 and second 3 electrodes,
$C_{O2}$ and $C_{O3}$ respectively being the values of the nominal capacitances of first 2 and second 3 electrodes at rest as a function of time,
$C_{PA2}$ and $C_{PA3}$ respectively being the values of the stray couplings linked to first 2 and second 3 electrodes,
$V_{OUT}$ being the output signal.

As in the previous case, the current comprises a component called "motional component" which depends on the sum of $V_{IN2}$ and $V_{IN3}$ and a component called "background component" which depends on the values of the nominal and stray capacitances.

If power splitter 7 is perfect, signals $V_{IN2}$ and $V_{IN3}$ are in antiphase, the sum becomes zero or negligible and only the "background component" remains.

The total output current $i_b$ which flows via additional electrode 6 is the sum of the currents induced by the excitation electrodes (here first 2 and second 3 electrodes), by the bias electrodes (here third 4 and fourth 5 electrodes) and by the stray capacitances. Total output current $i_b$ is at a first approximation equal to the sum of the previous three currents, i.e.:

$$i_b \approx (V_{P1} - V_{P2})\frac{dc(t)}{dt} + (C_{02} + C_{PA2})\frac{dV_{IN2}(t)}{dt} + $$
$$(C_{03} + C_{PA3})\frac{dV_{IN3}(t)}{dt} + 2C_0\frac{dV_{OUT}(t)}{dt}$$

This current then comprises a component linked to the resonance which originates from the detection electrodes and a component linked to the stray capacitances.

In a particular case where power splitter 7 is perfect, i.e. it delivers two signals perfectly in antiphase, for example with $V_{in}(t) = V_{IN2} = -V_{IN3}$ and with a substantially symmetric structure, the capacitances linked to first and second electrodes are equal ($C_{02} = C_{03}$) as are the stray capacitances. The sum of currents i2 and i3 corresponds to the sum of the stray components and is of the following form:

$$i_2 + i_3 = i_{PA2} + i_{PA3} \approx C_{PA2}\frac{dV_{in}(t)}{dt} - C_{PA3}\frac{dV_{in}(t)}{dt}$$

with,
$i_{PA2}$ and $i_{PA3}$ respectively the currents induced by first $C_{PA2}$ and second $C_{PA3}$ stray capacitances,
$C_{PA2}$ and $C_{PA3}$ respectively the electric capacitance values of the first and second stray capacitances, $$\frac{dV_{in}(t)}{dt}$$

representing the variation of the excitation signal as a function of time.

In general manner, the sum of the currents induced by the first and second stray capacitances ("background" components) is not zero, is of positive or negative value and is much lower than the "motional" component. If the sum $i_{PA2} + i_{PA3}$ is positive, the frequency response presents an anti-resonance peak placed after the resonance peak in the frequency spectrum, which theoretically corresponds to the transfer function of a RLC circuit having a stray capacitance $C_{PA}$ connected in parallel (parasitic behavior of capacitive type). If the sum is negative, the frequency response presents an anti-resonance peak placed before the resonance peak in the frequency spectrum, which theoretically corresponds to the transfer function of a RLC circuit having a virtually negative stray capacitance $C_{PA}$ connected in parallel (parasitic behavior of inductive type). In general manner, there are at least as many stray capacitances as there are excitation electrodes.

In the ideal case where the architecture of the resonator is symmetric, the system is balanced, and the capacitances formed by oscillating element 1 and first 2, second 3, third 4 and fourth 5 electrodes are identical. The current linked to the background disappears and only the resonance current remains.

In practice however, the architecture of the resonator is asymmetric as at least one of the capacitances formed by the first, second, third and fourth electrodes and the oscillating element presents a different value from that of the others and/or the excitation voltages are in antiphase but not of exactly the same amplitude.

The architecture proposed, the measuring configuration, is particularly advantageous to provide a solution for use of a non-symmetric device. By means of this architecture, the deviations from symmetry arising from the production method and/or from the non-idealness of means 7 can be compensated by means of first $V_{P1}$ and second $V_{P2}$ Bias DC voltages and of third DC voltage $V_b$. Indeed, subsequent to the inherent variations of the production methods used, the resonator architecture is often asymmetric, and the static capacitances of the four electrodes are not identical, which may result from an offset in the air-gap or in the facing surfaces. It is also conceivable for the two stray capacitances identified not to be perfectly identical and for voltage $V_{IN2}$ not to be perfectly equal to the opposite of voltage $V_{IN3}$.

Modulation of the values of first $V_{P1}$ and second $V_{P2}$ bias DC voltages and of third DC voltage $V_b$ enables the structure to be re-symmetrized. In this way it is possible to obtain a symmetric architecture favorable for elimination of the background signal effect by means of an electric compensation of the existing dimensional deviations and of the deviations linked to the instrumentation such as for example measurement peaks, splicing or connecting wires not ideally oriented as described in the foregoing and which thereby generate stray capacitances, or excitation voltages applied on electrodes 2 and 3 which are not of the same amplitude or with a phase difference exactly equal to 180°.

In practice, a resonator called symmetric is only obtained after a tuning step which enables the air-gap differences, the facing surface differences and the differences of excitation voltage Vin to be compensated. The tuning step is described further on. When a voltage is applied on a bias electrode, a force is created which will displace the rest position of the oscillating element. The bias electrodes, for example third 4 and fourth 5 bias electrodes, thereby enable the distance separating oscillating element 1 from first 2 and second 3 excitation electrodes at rest to be modulated. The bias electrode or electrodes have the twofold function of ensuring a non-zero induced current in oscillating element 1 and of modulating the air-gap between oscillating element 1 and at least one of excitation electrodes 2, 3.

If the resonator is symmetric or substantially symmetric before a bias voltage is applied on one of the bias electrodes, it is advantageous to preserve this symmetry by applying the same continuous force in the two oscillation directions defined by the excitation electrodes. It may also be envisaged to use one and the same electrode which presents one or more surfaces facing two surfaces of the oscillating element.

In a particular embodiment, third DC voltage $V_b$ (applied for example to the shaping circuit) is fixed as is first $V_{P1}$ or second $V_{P2}$ bias voltage. The remaining voltage $V_{P2}$ or $V_{P1}$ is then adjusted with respect to a predefined criterion. The predefined criterion can for example be complete elimination of the antiresonance peak or reaching a certain amplitude and phase change value at resonance. For example purposes, third DC voltage $V_b$ and first bias voltage $V_{P1}$ are fixed and second bias voltage $V_{P2}$ is then adjusted with respect to a predefined criterion. The electrostatic force, in static state, applied on third electrode 4 is proportional to the square of the difference $(V_b - V_{P1})^2$ between third DC voltage $V_b$ and first bias voltage $V_{P1}$. This electrostatic force will move the static equilibrium position of oscillating element 1 in the direction perpendicular to the surface of third electrode 4, which is tantamount to modifying the effective distance separating oscillating element 1 from first detection electrode 2 and from third electrode 4. In the same way, second bias voltage $V_{P2}$ modifies the static equilibrium position of oscillating element 1 in the direction perpendicular to the surface of fourth electrode 5.

The resonator phase can thereby be easily tuned by means of this structure. As shown in the foregoing, according to the sign of sum ($i_{P41}+i_{P42}$), the capacitive frequency response of the resonator comprises a background signal either of capacitive nature (influence of the stray parallel capacitance) or of inductive nature (influence of a pseudo-inductance, in other words a virtually negative stray parallel capacitance). The fact that the resonator can operate in a capacitive or inductive regime enables the phase difference of the input to be adjusted with respect to the output of the system. This adjustment can take place over a wide range by changing the sign of the product $V_b(V_{P1}-V_{P2})$, for example by changing the sign of voltage $V_b$ or by adjusting the difference $(V_b-V_{P1})$ with a constant difference $(V_{P1}-V_{P2})$.

Application of voltages $V_{P1}$ and $V_{P2}$ enables the resonator to be moved which results in a modification of its stiffness. In so far as the stiffness plays a role in formulation of the resonance frequency, modulation of voltages $V_{P1}$ and $V_{P2}$ enables the resonance frequency of the device to be modulated.

In another embodiment, the air-gap distance is corrected in two orthogonal directions, i.e. in the direction connecting first detection electrode 2 and third electrode 4 and in the direction connecting second detection electrode 3 and fourth electrode 5. The value of third DC voltage $V_b$ is fixed and the values of first $V_{P1}$ and second $V_{P2}$ voltages are then made to vary. During variation of these voltages, it can be chosen to maintain a constant voltage difference between first $V_{P1}$ and second $V_{P2}$ bias voltages. The value of the voltage difference is chosen such as to obtain a certain given equivalent motional resistance value. If a self-oscillator is to be constructed from this resonator, the motional resistance of the resonator does in fact have to be lower than a maximum resistance motional threshold value, a gain has to be higher than a threshold value and the phase change also has to be higher than a threshold value. By adjusting third DC voltage $V_b$ and the voltage difference between first $V_{P1}$ and second $V_{P2}$ bias voltages, tuning is then performed on voltage differences on the one hand between third DC voltage $V_b$ and first bias voltage $V_{P1}$ and on the other hand between third DC voltage $V_b$ and second bias voltage $V_{P2}$. The desired gain and phase change to fulfil self-oscillation conditions are thereby obtained.

It should further be noted that by means of this architecture, calculation of motional resistance Rm is modified. In this case, motional resistance Rm is proportional to the opposite of the product of the voltage difference between first $V_{P1}$ and second $V_{P2}$ bias voltages by third DC voltage $V_b$ applied on shaping circuit 10

$$R_M \propto \frac{1}{V_b(V_{P1}-V_{P2})},$$

unlike the prior art where there is only one bias voltage $V_P$ and therefore $$R_M \propto \frac{1}{V_P^2}.$$

The resistance is therefore a function of three bias voltages $V_{P1}$ and $V_{P2}$, and $V_b$. This represents a huge advantage in so far as there is no relation imposed between third DC voltage $V_b$ and the two bias voltages $V_{P1}$ and $V_{P2}$. It is therefore possible to obtain a low value of motional resistance Rm by judiciously modulating the value of the different voltages used.

If it is desired to work with a predefined motional resistance, it is then advantageous to reduce the value of the third DC voltage $V_b$ and to compensate this reduction by means of the voltage difference between first $V_{P1}$ and second $V_{P2}$ bias voltages. Reducing third DC voltage $V_b$ enables the resonator to be made to operate only in its linear mechanical regime which is required to maintain a good phase noise and not to lead the resonator to stick against one of the electrodes because of a too strong excitation.

In the architecture presented, the sign of the sum of the stray currents has an influence on the capacitive frequency response of the resonator. Depending on the sign of this sum of the currents, the nature of the background signal can be either capacitive (positive sign) or inductive (negative sign). In both cases, this results from the influence of the stray parallel capacitances but everything depends on their respective value.

In general manner, a symmetric architecture, i.e. an architecture which enables the influence of stray capacitances to be eliminated, is obtained by applying first, second and third DC voltages which have the effect of moving the position of oscillating element 1 with respect to the different electrodes present. This modification of the position of the oscillating element enables the value of the capacitors to be modified so as to modify the values of the nominal capacitances of first and second electrodes $C_{02}$ and $C_{03}$ and to enable the expression $[(C_{02}+C_{P42})\cdot V_{IN2}+(C_{03}+C_{P43})\cdot V_{IN3}]$ to tend to 0. This expression is representative of the background current component linked to the excitation electrodes. It is also possible to reduce a fault linked to power splitter 7, therefore on $V_{IN2}$ and $V_{IN3}$, by modulating the values of $C_{02}$ and $C_{03}$ by means of DC voltages $V_{P1}$ and $V_{P2}$.

In a particular embodiment illustrated in FIG. 6, the resonator is integrated to form an oscillator. Additional elements have to be added for the circuit to comply with Barkhausen conditions in terms of gain and phase. The oscillator comprises a gain and phase difference tuning circuit 11 connected to means 7. Phase adjustment, which is critical to obtain an oscillator from a resonator, is easy to achieve with this type of resonator for, as explained in the foregoing, the phase conditions necessary for obtaining an oscillator can be easily obtained by adjusting the sign of the product $V_b(V_{P1}-V_{P2})$ and by then adjusting the value of the difference $(V_b-V_{P1})$ with a constant difference $(V_{P1}-V_{P2})$.

The oscillator comprises a closed-loop control circuit 10, 11 and 7 which provides the gain and phase difference necessary to trigger self-oscillation of the resonator. The closed-loop control circuit delivers two voltages of the same amplitude in antiphase on output. The closed-loop control circuit can for example be formed by an amplifier associated with a power divider or splitter.

This embodiment is particularly advantageous as this architecture makes for better mechanical balancing of the resonator in particular for obtaining identical air-gaps for the excitation electrodes.

In a particular embodiment illustrated in FIG. 7, additional electrode 6 is connected to a first input of an amplifier 12 which forms part of shaping circuit 10. A resistor 13 having a resistance value at least equal to that of motional resistance Rm is connected in feedback manner, i.e. between the output terminal and the input terminal connected to additional electrode 6. Third Bias DC voltage Vb is applied on the second input of amplifier 12. The output terminal is connected to the first and second excitation electrodes so as to provide signals in antiphase and of the same amplitude. In the embodiment illustrated, this is achieved by means of a direct connection between the output terminal and one of the excitation electrodes whereas the other excitation electrode is connected to the output terminal of the amplifier by means of an inverter 14. In this case, the association of inverter 14 and amplifier 12 forms means 7 and shaping circuit 10.

Figure 8:
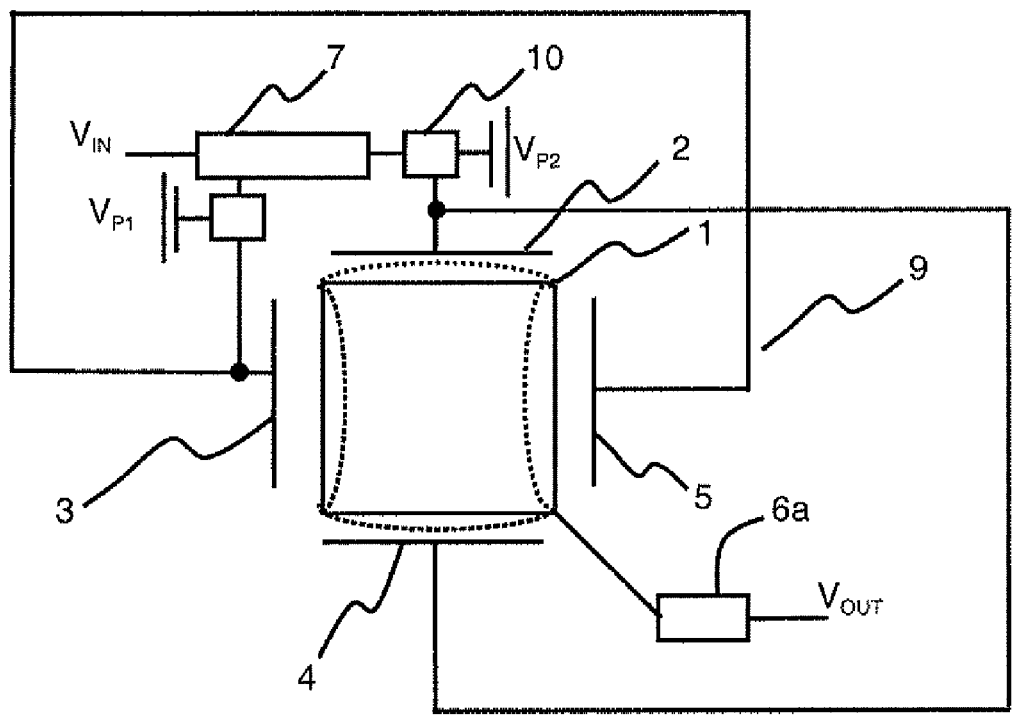
FIG. 8 represents another embodiment of an oscillator obtained by means of a resonator, in schematic manner.

In the particular embodiment illustrated in FIG. 8, the pairs of opposite electrodes are subjected to the same signal. Electrode 3 and electrode 5 thus receive the same signal. The same is the case for electrodes 2 and 4. Excitation signal $V_{INT}$ is applied to the input of means 7 and each of the outputs is biased. The oscillating element moves towards the first group of electrodes whereas it moves away from the second group of electrodes. In this embodiment, it is not possible to compensate a symmetry problem as the same voltage is applied on two opposite electrodes. In the previous embodiments, the bias electrode was in fact distinct from the excitation electrodes to enable static positioning of the resonator to be modified.

There is then a group of first excitation electrodes and a group of second excitation electrodes. Each group receives the same excitation signal. The first and second excitation groups can receive an AC component and a DC component. The AC components between the first and second groups of electrodes are in antiphase, which enables the level of the background current to be reduced making the previous equation tend to 0. It thereby becomes simple to obtain a structure using electrodes groups with a reduced background signal.

For example purposes, a first set of electrodes is biased by means of voltage $V_{P1}$ and a second set of electrodes is biased by means of voltage $V_{P2}$. The AC components in antiphase are thereby applied to the two sets of electrodes which each have a DC component provided by $V_{P1}$ or $V_{P2}$.

The invention claimed is:

1. A resonator comprising:
   an oscillating element,
   first and second excitation electrodes of the oscillating element each having a main surface at least partially facing the oscillating element,
   means for applying a signal having an AC component on each excitation electrode to make the oscillating element oscillate by means of the excitation electrodes so that as the oscillating element moves towards one of the excitation electrodes, it moves away from the other excitation electrode, wherein the AC components are in antiphase between the first and second excitation electrodes,
   an additional electrode electrically connected to the oscillating element at a point such that the capacitive influences of the excitation electrodes neutralize one another,
   means for applying a DC voltage difference between the oscillating element and excitation electrodes,
   a signal representative of oscillation of the oscillating element provided via the additional electrode,
   a bias electrode connected to a first DC voltage source.

2. The resonator according to claim 1 wherein the signal representative of oscillation of the oscillating element is provided via a shaping circuit connected to the additional electrode.

3. The resonator according to claim 2 wherein a third bias source is connected to the shaping circuit to apply a DC voltage difference between the oscillating element and excitation electrodes.

4. The resonator according to claim 2 wherein the shaping circuit is a bias tee.

5. The resonator according to claim 2 wherein the shaping circuit is an amplifier comprising a feedback-connected resistor, the resistor having a value at least equal to a motional resistance of the oscillating element.

6. The resonator according to claim 1 comprising a plurality of the first excitation electrodes all being in a first plane and/or a plurality of the second excitation electrodes all being in a second plane.

7. The resonator according to claim 1 comprising a plane of symmetry between the first and second excitation electrodes, the additional electrode being located along the plane of symmetry.

8. The resonator according to claim 1 wherein the additional electrode is formed by one of anchoring points of the oscillating element.

9. The resonator according to claim 1 comprising a plurality of bias electrodes.

10. An oscillator comprising a resonator according to claim 1, comprising a closed-loop control circuit connected on the one hand to the excitation electrodes and on the other hand to the additional electrode.

11. A method for producing a resonator comprising an oscillating element excited by means of first and second excitation electrodes, a method comprising:
    applying an excitation signal with an AC component on each of the excitation electrodes, the AC components being in antiphase between the first and second excitation electrodes,
    applying a first bias DC voltage to a third electrode to move the oscillating element so as to reduce the value of the following equation:

$[(C_{02}+C_{PA\,2})\cdot V_{IN2}+(C_{03}+C_{PA\,3})\cdot V_{IN3}]$ in which $C_{PA2}$ and $C_{PA3}$ are respectively the electric capacitance values of the first and second stray capacitances linked to the excitation electrodes,
    $V_{IN2}$ and $V_{IN3}$ are the AC components respectively applied to the first excitation electrode and to the second excitation electrode,
    $C_{02}$ and $C_{03}$ are respectively the values of the nominal rest capacitances as a function of time of the first and second excitation electrodes,
    applying a DC voltage difference between the oscillating element and the excitation electrodes,
    measuring an output signal on an additional electrode.

12. A resonator comprising:
    an oscillating element,
    first and second excitation electrodes of the oscillating element each having a main surface at least partially facing the oscillating element,
    a first tension source having a first AC component and connected to the first excitation electrode,
    a second tension source having a second AC component and connected to the second excitation electrode, the first and the second AC components are in antiphase so as to cause the oscillating element to move towards one of the excitation electrodes when the oscillating element moves away from the other excitation electrode,
    an additional electrode electrically connected to the oscillating element at a point such that capacitive influences of the excitation electrodes neutralize one another,
    a voltage source configured for applying a DC voltage difference between the oscillating element and the first and second excitation electrodes,
    a signal representative of oscillation of the oscillating element provided via the additional electrode, and
    a bias electrode connected to a first DC voltage source.

* * * * *